(12) United States Patent
Huang et al.

(10) Patent No.: US 8,592,242 B2
(45) Date of Patent: Nov. 26, 2013

(54) ETCHING GROWTH LAYERS OF LIGHT EMITTING DEVICES TO REDUCE LEAKAGE CURRENT

(75) Inventors: Hung-Wen Huang, Hsinchu (TW); Hsing-Kuo Hsia, Jhubei (TW); Ching-Hua Chiu, Hsinchu (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 121 days.

(21) Appl. No.: 12/949,316

(22) Filed: Nov. 18, 2010

(65) Prior Publication Data

US 2012/0126262 A1      May 24, 2012

(51) Int. Cl.
*H01L 21/00*      (2006.01)
(52) U.S. Cl.
USPC ............................................................ 438/52
(58) Field of Classification Search
None
See application file for complete search history.

(56) References Cited

U.S. PATENT DOCUMENTS

| | | | |
|---|---|---|---|
| 7,629,195 B2* | 12/2009 | Tran et al. ........................ | 438/52 |
| 2005/0208689 A1* | 9/2005 | Erchak et al. .................... | 438/25 |
| 2008/0029773 A1* | 2/2008 | Jorgenson ........................ | 257/94 |
| 2010/0006864 A1* | 1/2010 | Steigerwald .................... | 257/88 |

* cited by examiner

Primary Examiner — Charles Garber
Assistant Examiner — Andre C Stevenson
(74) Attorney, Agent, or Firm — Haynes and Boone, LLP

(57) ABSTRACT

The present disclosure relates to methods for fabricating LEDs by patterning and etching an n-doped epitaxial layer to form regions of roughened surface of the n-doped layer and mesa structures adjacent to the roughened surface regions before depositing an active layer and the rest of the epitaxial layers on the mesa structures. The method includes growing epitaxial layers of an LED including an un-doped layer and an n-doped layer on a wafer of growth substrate. The method also includes patterning the n-doped layer to form a first region of the n-doped layer and a mesa region of the n-doped layer adjacent to the first region. The method further includes etching the first region of the n-doped layer to create a roughened surface. The method further includes growing additional epitaxial layers of the LED including an active layer and a p-doped layer on the mesa region of the n-doped layer.

19 Claims, 8 Drawing Sheets

ETCHING GROWTH LAYERS OF LIGHT EMITTING DEVICES TO REDUCE LEAKAGE CURRENT

BACKGROUND

Light emitting diodes (LEDs) emit light when voltages are applied to p-type and n-type layers sandwiching a light emitting active layer. Traditional methods of fabricating LEDs consist of growing and patterning epitaxial layers of semiconductor materials on a wafer having a growth substrate using semiconductor manufacturing processes. To increase light extraction efficiency from the LEDs, regions of the n-type layer adjacent to the LEDs are etched to obtain a roughened surface. The roughened surface of the n-type layer acts as a scattering mirror to reflect upward light emitted from the active layer and to reduce internal reflection of light trapped within the n-type layer. To obtain the roughened surface, epitaxial layers adjacent to LEDs are etched to expose the n-type layer, a passivation layer is deposited to cover sidewalls of the LEDs to protect the active layer, and the exposed n-type layer is further etched by a wet etching or a plasma etching process to roughen its surface.

While existing methods of fabricating LEDs have generally been adequate for many purposes, they have not been entirely satisfactory. For example, etching the epitaxial layers to expose the n-type layer may damage sidewalls of the active layer, resulting in electrical leakage paths and a reduction in quantum efficiency of the LEDs. In addition, depositing a passivation layer to protect sidewalls of the active layer incurs extra manufacturing time and cost. Furthermore, the passivation layer does not completely protect sidewalls of the active layer from the roughening process, causing further increases in leakage paths and degradation in quantum efficiency. Accordingly, there is a need for LED fabrication methods that increase light extraction and quantum efficiencies of the LEDs without adding manufacturing complexities.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
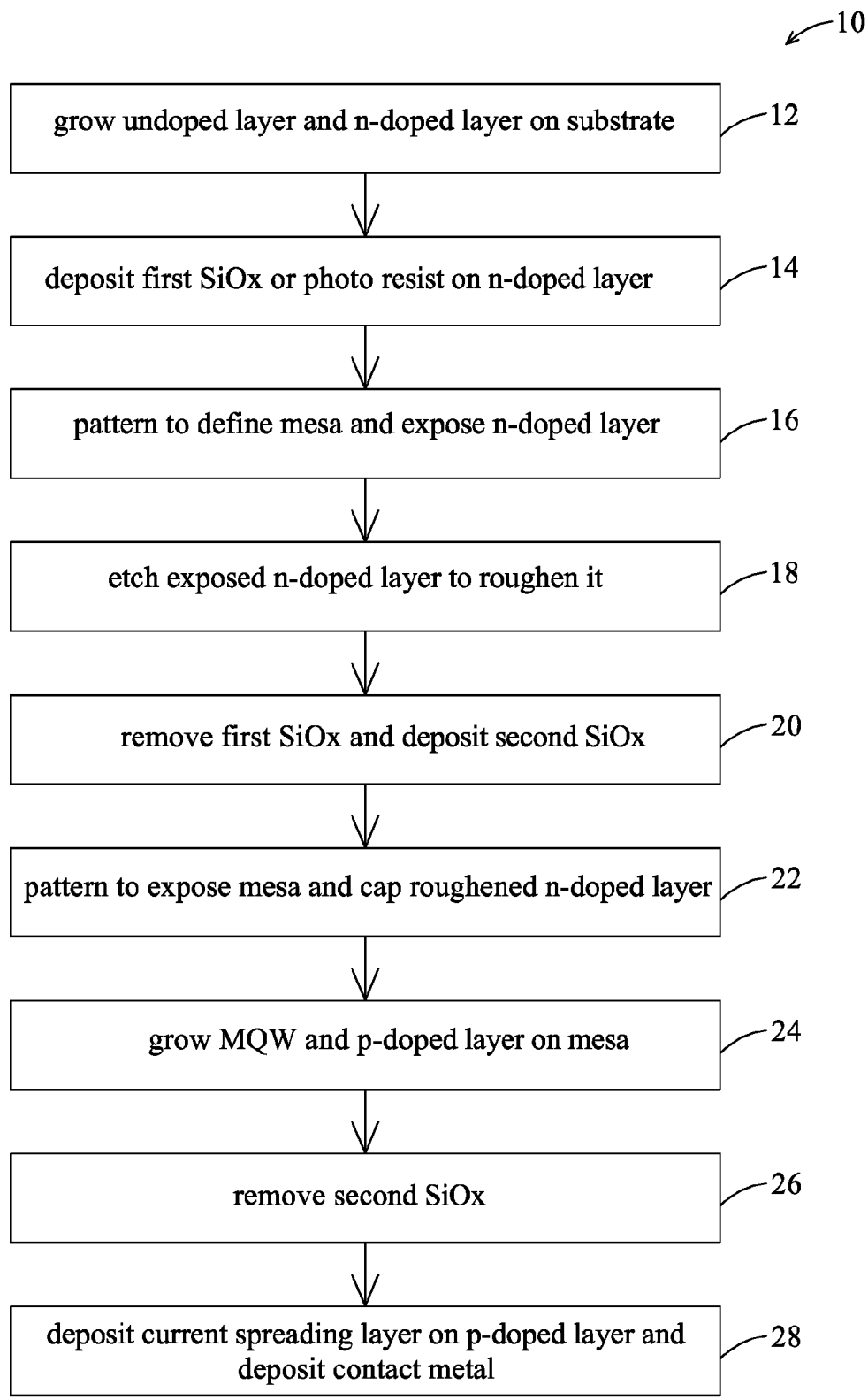
FIG. 1 shows a flowchart of a method for fabricating semiconductor LEDs by roughening regions of an n-doped layer before performing partial growth of epitaxial layers of the LEDs according to one or more embodiments of the present disclosure.

The present disclosure relates to LEDs fabricated by patterning and etching an n-doped epitaxial layer to form regions of roughened surface of the n-doped layer and mesa structures adjacent to the roughened surface regions before depositing an active layer and the rest of the epitaxial layers on the mesa structures. LEDs are produced with higher light extraction efficiency, better quality crystals in the epitaxial layers, and reduced leakage current. It is understood that the present disclosure provides many different forms and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," "connected to" or "coupled to" another element or layer, it may be directly on, connected to, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

FIG. 1 shows a flowchart of a method 10 for fabricating semiconductor LEDs by roughening regions of an n-doped layer before performing partial growth of epitaxial layers of the LEDs according to one or more embodiments of the present disclosure. Method 10 patterns the n-doped layer to expose regions for roughening and to define mesa structures for growing an active layer and the rest of the epitaxial layers of the LEDs. Etching the exposed n-doped layer to roughen its surface before growing the active layer avoids damages to the active layer and reduces electrical leakage paths. In the present embodiment, method 10 is explained with reference to fabricating gallium nitride (GaN) LEDs. However, method 10 may be applied to fabricating LEDs using other materials.

In step 12, epitaxial layers are deposited on a wafer of growth substrate suitable for growing LEDs. In the present embodiment, the epitaxial layers include an un-doped GaN layer and an n-doped GaN layer (n-GaN) grown on a sapphire substrate. An alternative embodiment may only include an un-doped GaN layer grown on a sapphire substrate. Alternative growth substrates include silicon carbide, silicon, or other materials. The un-doped GaN layer includes a low temperature nucleation layer to reduce lattice mismatch between the sapphire substrate and the n-GaN layer or other epitaxial layers. The epitaxial layers may be deposited by processes such as metal organic chemical vapor deposition (MOCVD) or other deposition processes.

In step 14, a first dielectric layer or a layer of photoresist material is deposited to cover the n-GaN layer by PECVD (plasma enhanced chemical vapor deposition). The dielectric layer may include silicon oxide or other dielectric materials. In step 16, the dielectric layer or the layer of photoresist material is patterned by a photolithography process to cover mesa structures upon which the rest of the epitaxial layers will be grown. In one or more embodiments of the present disclosure, regions of the n-GaN layer adjacent to the mesa structures are exposed and are etched using processes such as buffered oxide etching (BOE), reactive ion etching (RIE) with plasma ions, or other inductively coupled plasma (ICP) processes. The etching process removes a top portion of the exposed n-GaN layer to define the mesa structures. Thus, mesa structures of un-doped GaN and n-doped GaN layers capped by the patterned dielectric layer or photoresist layer are defined by adjacent regions of exposed and thinned n-GaN layer. In other embodiments, regions of the exposed n-GaN layer adjacent to the mesa structures are not thinned by an etching process prior to their roughening in step 18 below.

In step 18, the exposed regions of the n-GaN layer are further etched to create a roughened surface with a height of the roughened features ranging from a few hundred nanometers to about one micrometer. The exposed n-GaN regions are roughened by an etching process such as a photo-electrochemical etching process using potassium hydroxide (KOH) or plasma etching. The mesa structures are protected from the etching process by the dielectric layer or photoresist layer capping the mesa structures. The roughened n-GaN surface regions adjacent to the mesa structures act as scattering minors to increase light extraction from the LEDs by scattering upward emitted light from the active layer on the mesa structures. The roughened regions also increase light extraction by reducing internal reflection of emitted light trapped in the n-GaN layer.

In step 20, the first dielectric layer or photoresist capping the mesa structures is removed from the mesa structures. A second dielectric layer or photoresist is deposited on the n-GaN layer by PECVD. Again, the dielectric layer may include silicon oxide or other dielectric materials. In step 22, the second dielectric layer or photoresist is patterned by a photolithography process to cover the roughened surface regions of the n-GaN layer, exposing the top n-GaN layer of the mesa structures. The second dielectric layer or photoresist capping the roughened surface regions of the n-GaN layer may protrude higher than the top of the mesa structures to better confine the active layer which will be grown to within the mesa structures. Alternatively, the top of the second dielectric layer or photoresist may be lower than the top of the mesa structure.

In step 24, a multiple quantum well (MQW) active layer followed by a p-doped GaN layer (p-GaN) are deposited on the exposed surface of the mesa structures by a process such as MOCVD, physical vapor deposition (PVD), atomic level deposition (ALD), or other deposition processes. To reduce sidewall leakage paths, the p-GaN layer is deposited to cap the active layer on both the top and lateral sides of the active layer. To facilitate capping the active layer on the lateral sides, the top of the active layer may be grown to be higher than the top of the second dielectric layer or photoresist capping the roughened surface regions of the n-GaN layer. Accordingly, when the p-GaN layer is deposited, the lateral sides of the active layer protruding above the top of the second dielectric layer or photoresist may also be capped. Because the active layer is grown only on the top n-GaN surface areas of the mesa structures after etching of the n-GaN layer adjacent to the mesa structures, the active layer growth experiences less stress from lattice mismatch between the sapphire substrate and the n-GaN layer. In addition, the top and the lateral sides of the mesa structures afford a larger surface area for strain release of the stress from any underlying lattice mismatch. As a result, there is better crystal quality in the epitaxial layers of the LEDs, resulting in improved quantum efficiency. Furthermore, because etching of the n-GaN layer was performed before depositing the active layer, there is no need for a sidewall passivation layer to protect the active layer during etching, simplifying the fabrication process of LEDs.

In step 26, the second dielectric layer or photoresist capping the roughened n-GaN layer is removed. In step 28, a transparent current spreading layer is deposited on top of the p-GaN layer of the mesa structures. The current spreading layer helps to create a more uniform current density in the epitaxial layers for improved light extraction. The current spreading layer includes indium tin oxide (InTO) or zinc oxide (ZnO). P-electrodes are deposited on the current spreading layer of the mesa structures to form p-contact metal for the p-GaN layer. Similarly, n-electrodes are deposited on the exposed and roughened surface of the n-GaN layer form n-contact metal to the n-GaN layer. P-electrodes and n-electrodes may include metals with good conductive properties.

Figure 2:
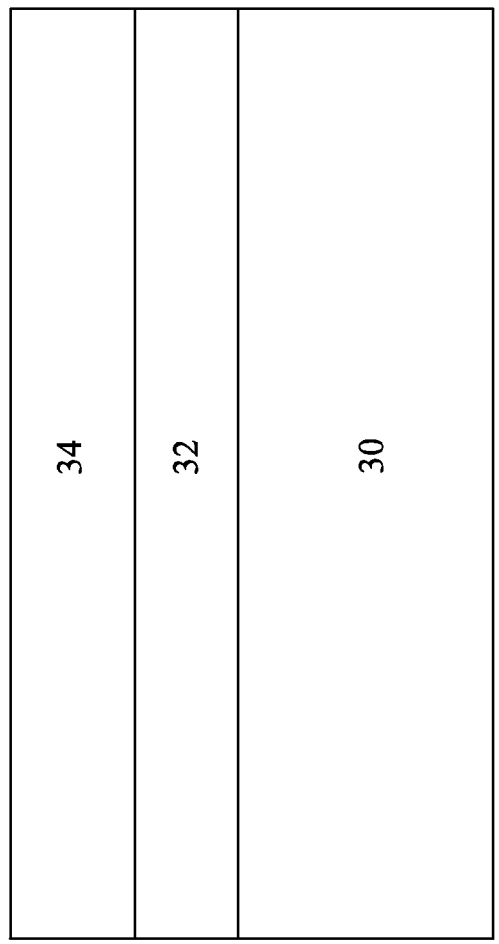
FIG. 2 shows a cross-sectional view of a wafer after depositing an n-doped layer of an LED die using the method of FIG. 1 according to one or more embodiments of the present disclosure.

FIG. 2 shows a cross-sectional view of a wafer after depositing an n-doped layer of an LED die using method 10 of FIG. 1 according to one or more embodiments of the present disclosure. In particular, FIG. 2 shows a cross-sectional view of the epitaxial layers after step 12 of method 10.

A growth substrate 30 suitable for growing LEDs is provided. In the present embodiment, growth substrate 30 is made of sapphire for growing GaN LEDs. Alternative embodiments of growth substrate 30 may include silicon-based substrates such as silicon carbide, silicon, or other substrates. A low temperature un-doped layer is deposited on growth substrate 30 to reduce a lattice mismatch between growth substrate 30 and an n-doped layer or other epitaxial layers to be deposited. In the present embodiment, the un-doped layer is an un-doped GaN layer 32. Alternative embodiments of the un-doped layer may include aluminum nitride (AlN). In the present embodiment, an n-doped GaN layer 34 is deposited on un-doped GaN layer 32. In other embodiments, there may not be an n-doped GaN layer 34 deposited on un-doped GaN layer 32. Thus, growth substrate 30 acts as a seed crystal to allow un-doped GaN layer 32 and other epitaxial layers to take on a lattice structure and an orientation that is substantially identical to that of the growth substrate 30. Deposition of un-doped GaN layer 32 and n-doped GaN layer 34 may be by MOCVD, PVD, ALD, or other deposition processes.

Figure 3:
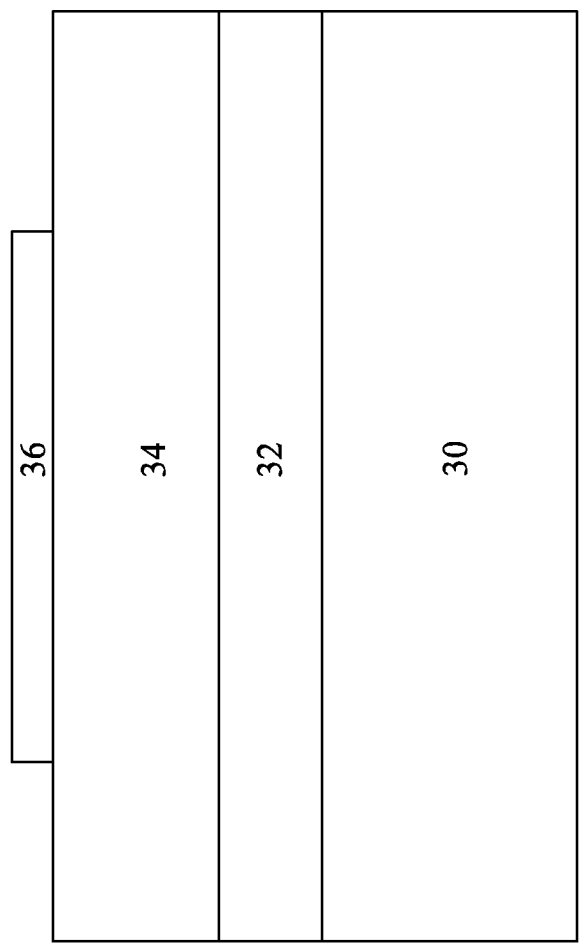
FIG. 3 shows a cross-sectional view of a wafer after patterning a first dielectric layer to define a mesa structure of an LED die using the method of FIG. 1 according to one or more embodiments of the present disclosure.

FIG. 3 shows a cross-sectional view of a wafer after patterning a first dielectric layer to define a mesa structure of an LED using method 10 of FIG. 1 according to one or more embodiments of the present disclosure. In particular, FIG. 3 shows a cross-sectional view of the epitaxial layers after step 16 of method 10.

A first dielectric layer 36 is deposited on n-doped GaN layer 34. In the present embodiment, first dielectric layer 36 is silicon oxide. Alternative embodiments may include other dielectric materials or a photoresist material. Deposition of first dielectric layer 36 may be by PECVD. First dielectric layer 36 is patterned so that it caps regions of n-doped GaN layer 34 which will be used for growing additional epitaxial layers of the LED. The exposed regions of n-doped GaN layer 34 will be further etched to form a scattering surface for the LED. Thus, mesa structures including n-doped GaN layer 34 capped by first dielectric layer 36 are defined adjacent to and surrounded by exposed regions of n-doped GaN layer 34. In other embodiments, regions of n-doped GaN layer 34 uncapped by first dielectric layer 36 is etched to remove a top portion of the exposed n-doped GaN layer 34. Etching of the exposed n-doped GaN layer 34 may be by BOE, RIE, ICP, or other dry etching processes.

Figure 4:
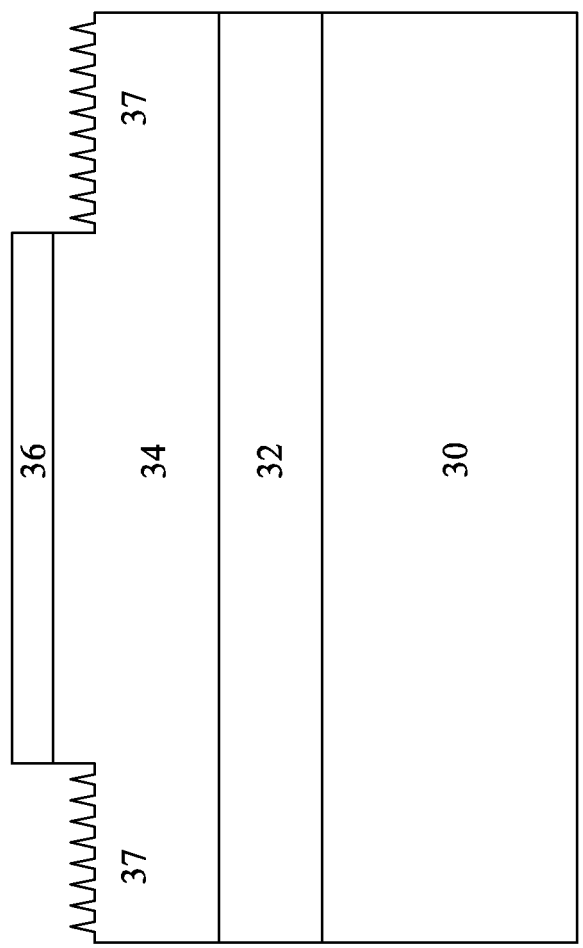
FIG. 4 shows a cross sectional view of a wafer after etching the exposed n-doped layer of an LED die to form a roughened n-doped surface using the method of FIG. 1 according to one or more embodiments of the present disclosure.

FIG. 4 shows a cross sectional view of a wafer after etching the exposed n-doped layer of an LED die to form a roughened n-doped surface using method 10 of FIG. 1 according to one or more embodiments of the present disclosure. In particular, FIG. 4 shows a cross-sectional view of the epitaxial layers after step 18 of method 10.

Exposed regions of n-doped GaN layer 34 are etched to roughen its surface, creating a scattering mirror to scatter light upward and to reduce internal light reflection of light reflected into n-doped GaN layer 34, un-doped GaN layer 32, and growth substrate 30. Thus, roughened regions 37 of n-doped GaN layer 34 improve light extraction efficiency of the LED. Roughened regions 37 of n-doped GaN layer 34 may have features that range in height from a few hundred nanometers to about a micrometer. Etching of n-doped GaN layer 34 to roughen it may be by photo-electrochemical etching processes or plasma etching processes. First dielectric layer 36 protects the mesa structure from the etching process so that only the exposed regions of n-doped GaN layer 34 are roughened. Because etching is performed without an active layer, there is no risk of damaging the active layer or its crystal quality, helping to improve quantum efficiency and reducing sidewall electrical leakage of the epitaxial layers. Etching of n-doped GaN layer 34 before growing the active layer also relieves stress from lattice mismatch between growth substrate 30 and n-doped GaN layer 34, further improving quantum efficiency.

Figure 5:
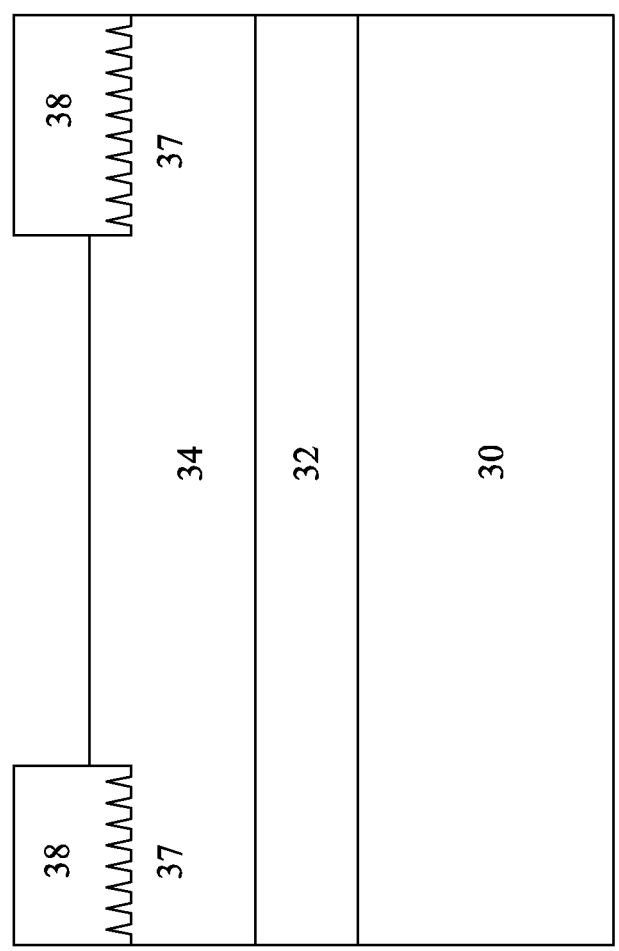
FIG. 5 shows a cross-sectional view of a wafer of after patterning a second dielectric layer to cover a roughened n-doped surface using the method of FIG. 1 according to one or more embodiments of the present disclosure.

FIG. 5 shows a cross-sectional view of a wafer after patterning a second dielectric layer to cover a roughened n-doped surface using method 10 of FIG. 1 according to one or more embodiments of the present disclosure. In particular, FIG. 5 shows a cross-sectional view of the epitaxial layers after step 22 of method 10.

First dielectric layer 36 capping n-doped GaN layer 34 of the mesa structure is removed. A second dielectric layer 38 is deposited on n-doped GaN layer 34. In the present embodiment, second dielectric layer 38 is silicon oxide, the same as first dielectric layer 36. Alternative embodiments may include other dielectric materials or a photoresist material. Deposition of second dielectric layer 38 may again be by PECVD. Second dielectric layer 38 is patterned so that it caps roughened regions 37 of n-doped GaN layer 34, leaving un-roughened n-doped GaN layer 34 of the mesa structure exposed. In the present embodiment, second dielectric layer 38 is grown to protrude above the top surface of un-roughened n-doped GaN layer 34 to define a slightly recessed mesa structure for growing an active layer. In other embodiments, the top surface of second dielectric layer 38 may be lower than the top surface of un-roughened n-doped GaN layer 34.

Figure 6:
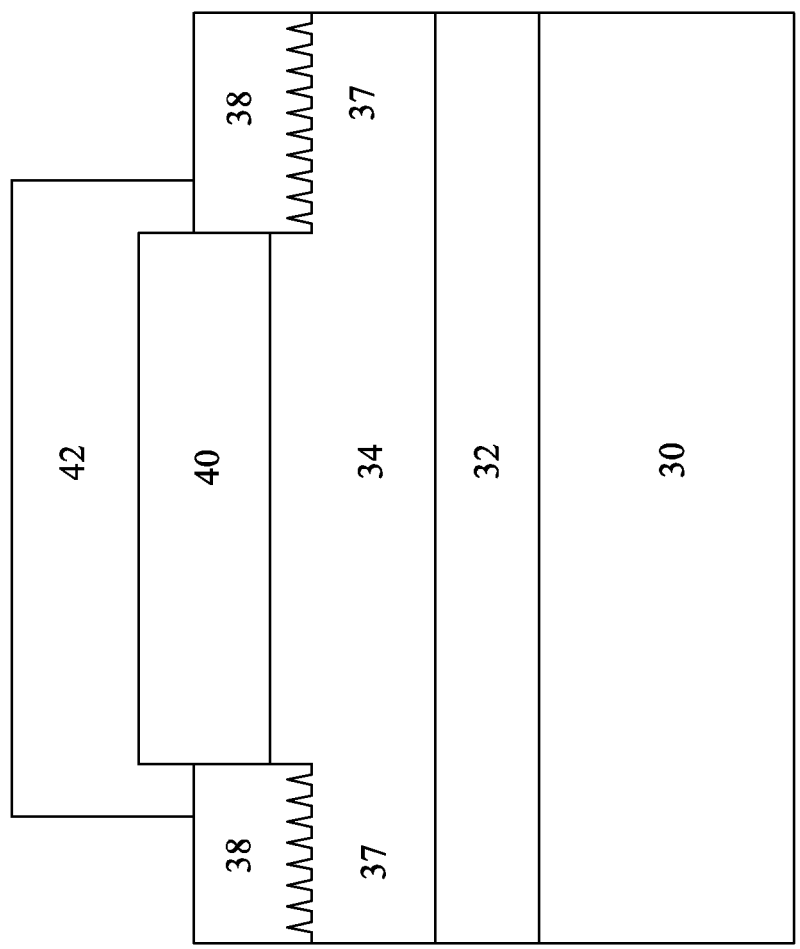
FIG. 6 shows a cross-sectional view of a wafer after depositing a p-doped layer on a mesa structure of an LED die using the method of FIG. 1 according to one or more embodiments of the present disclosure.

FIG. 6 shows a cross-sectional view of a wafer after depositing a p-doped layer on the mesa structure of an LED die using method 10 of FIG. 1 according to one or more embodiments of the present disclosure. In particular, FIG. 6 shows a cross-sectional view of the epitaxial layers after step 24 of method 10.

A MQW active layer 40 is deposited on un-roughened n-doped GaN layer 34 confined within the recessed mesa structure to continue growing the epitaxial layers for the LED. Active layer 40 may include alternating (or periodic) layers of GaN and indium gallium nitride (InGaN). For example, in one embodiment, active layer 40 includes at least 7 alternating layers of GaN and InGaN. The top surface of active layer 40 is grown to be higher than the top surface of second dielectric layer 38 capping the roughened regions 37 of n-doped GaN layer 34. As discussed, because active layer 40 is grown only on n-doped GaN layer 34 of the mesa structure and because n-doped GaN layer 34 adjacent to the mesa structures has been etched, active layer 40 experiences less stress from lattice mismatch between growth substrate 30 and n-doped GaN layer 34.

A p-doped GaN layer 42 is deposited on active layer 40. P-doped GaN layer 42 is grown to cap the top surface and the sidewalls of active layer 40 protruding above the top surface of second dielectric layer 38. Capping the sidewalls of active layer 40 reduces sidewall leakage paths and improves electrical property of the LED. In addition, because etching of n-doped GaN layer 34 is completed before growing active layer 40 on the epitaxial layers, active layer 40 and p-doped GaN layer 42 do not require a passivation layer on their sidewalls to protect them against the etching process, simplifying fabrication of the LED. Deposition of active layer 40 and p-doped GaN layer 42 may be by MOCVD, PVD, ALD, or other deposition processes.

After the completion of the epitaxial growth process, a P/N junction (or a P/N diode) is essentially formed by active layer 40 situated between n-doped GaN layer 34 and p-doped GaN layer 42. When an electrical voltage (or electrical charge) is applied to n-doped GaN layer 34 and p-doped GaN layer 42, electrical current flows through the LED, and active layer 40 emits light. The color of the light emitted by active layer 40 is associated with the wavelength of the light, which may be tuned by varying the composition and structure of the materials that make up active layer 40.

Figure 7:
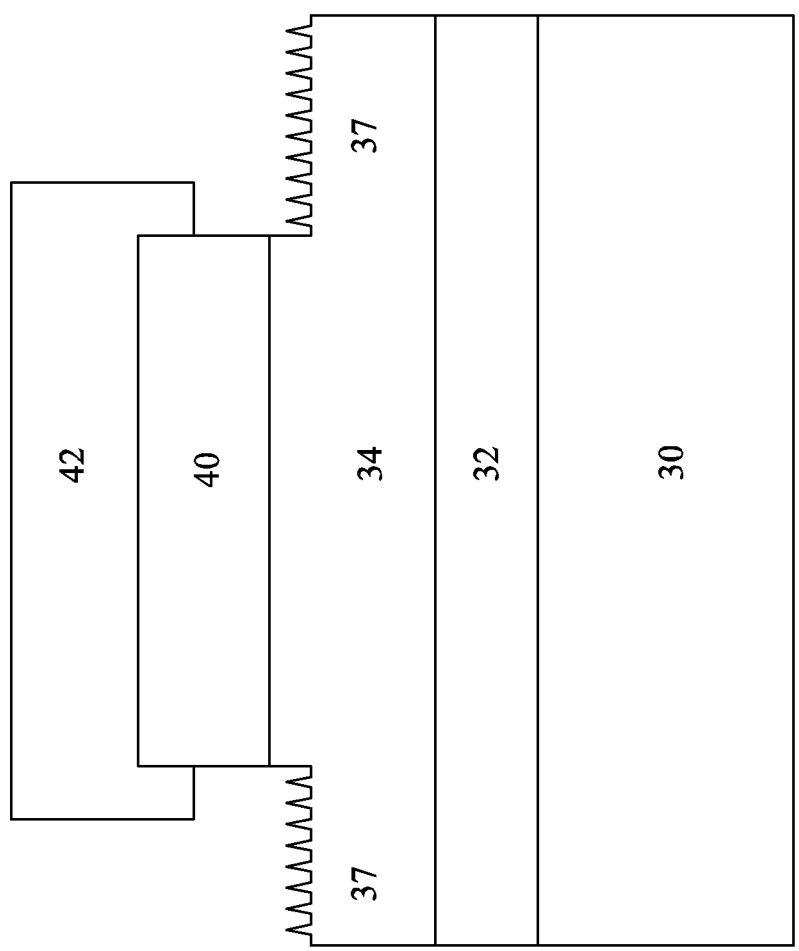
FIG. 7 shows a cross-sectional view of a wafer after removing the second dielectric layer of an LED die using the method of FIG. 1 according to one or more embodiments of the present disclosure.

FIG. 7 shows a cross-sectional view of a wafer after removing the second dielectric layer of an LED die using method 10 of FIG. 1 according to one or more embodiments of the present disclosure. In particular, FIG. 7 shows a cross-sectional view of the epitaxial layers after step 26 of method 10.

Second dielectric layer 38 capping roughened regions 37 of n-doped GaN layer 34 is removed to expose the roughened surface of n-doped GaN layer 34 adjacent to the mesa structure. The mesa structure contains the epitaxial layers of the LED and includes p-doped GaN layer 42 capping the top and part of the sidewalls of active layer 40, un-roughened n-doped GaN layer 34, un-doped GaN layer 32, and growth substrate 30.

Figure 8:
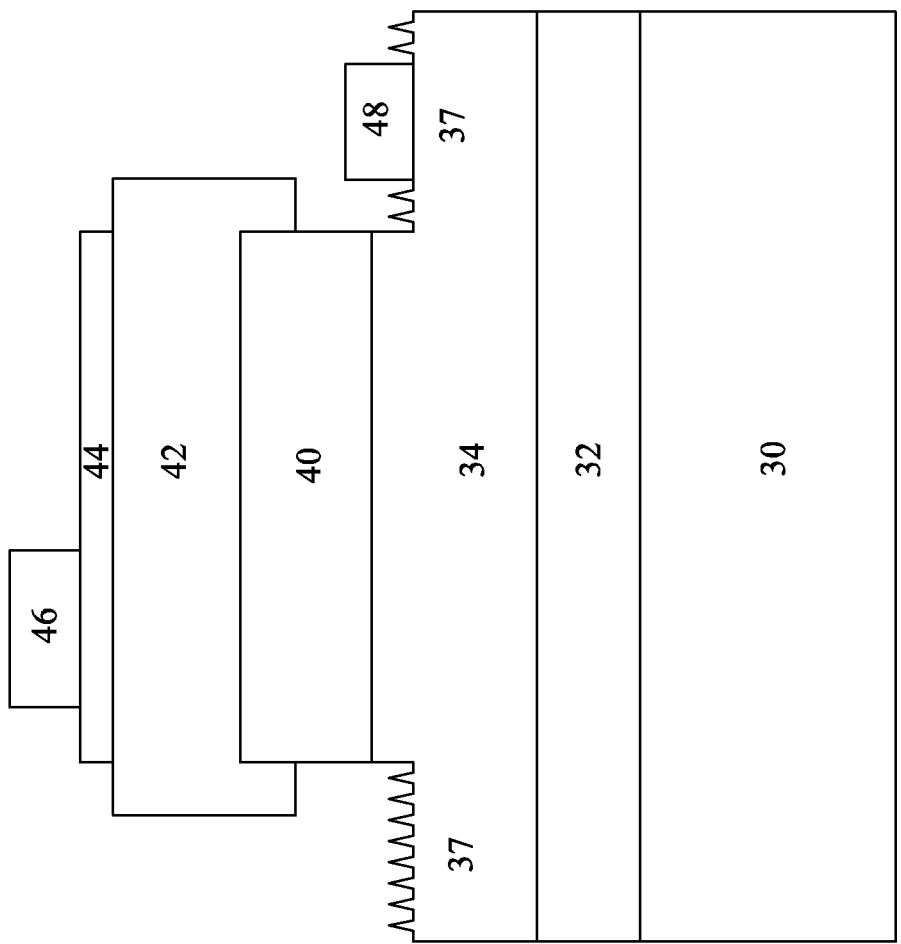
FIG. 8 shows a cross-sectional view of a wafer after depositing n-contact and p-contact metal using the method of FIG. 1 according to one or more embodiments of the present disclosure.

FIG. 8 shows a cross-sectional view of a wafer after depositing n-contact and p-contact metal using the method of FIG. 1 according to one or more embodiments of the present disclosure. In particular, FIG. 8 shows a cross-sectional view of the epitaxial layers after step 28 of method 10.

A transparent current spreading layer 44 is deposited and patterned on p-doped GaN layer 42 to create a more uniform current density to increase light extraction of the LED. In the present embodiment, current spreading layer 44 is made from InTO. Alternative embodiments of current spreading layer 44 include ZnO or other transparent materials with good conductivity. In one or more embodiments, additional layers such as an $n^+$-InGaN/GaN short period super-lattice layer may be deposited on p-doped GaN layer 42 to block crystal defect before depositing current spreading layer 44.

P-electrode 46 is deposited on current spreading layer 44 as a metal contact for p-doped GaN layer 42. Similarly, n-electrode 48 is deposited on roughened regions 37 of n-doped GaN layer 34 as a metal contact for n-doped GaN layer 34. P-electrode 46 and n-electrode 48 include metals that have good conductive properties and are suitable for bonding, such as gold, gold alloy, copper, copper alloy, nickel, nickel alloy, platinum, platinum alloy, titanium, titanium alloy, or combinations thereof. Current spreading layer 44, p-electrode 46, and n-electrode 48 may be deposited by electroplating. Thus, when power is applied to p-electrode 46 and n-electrode 48, emitted light from active layer 40 is reflected upward by roughened regions 37 of n-doped GaN layer 34 to increase light extraction from the LED. In addition, roughened regions 37 of n-doped GaN layer 34 reduce internal light reflection of light emitted into n-doped GaN layer 34, un-doped GaN layer 32, and growth substrate 30.

Thus, the present disclosure provides a method for fabricating LEDs. In accordance with one or more embodiments of the present disclosure, the method includes providing a growth substrate. The method also includes growing epitaxial layers including an un-doped layer above the growth substrate and an n-doped layer above the un-doped layer. The method also includes patterning the n-doped layer to form a first region of the n-doped layer and a mesa region of the n-doped layer adjacent to the first region. The method further includes etching the first region of the n-doped layer to create a roughened surface of the first region of the n-doped layer. The method further includes growing additional epitaxial layers including an active layer above the mesa region of the n-doped layer and a p-doped layer above the active layer. The method further includes forming metal contacts on the p-doped layer and on the roughened surface of the n-doped layer.

In accordance with one or more embodiments of the present disclosure, a method of fabricating LEDs includes providing a growth substrate. The method also includes growing an n-doped layer of a semiconductor material on the growth substrate. The method also includes forming a patterned first dielectric layer to cover a mesa region of the n-doped layer. The method also includes etching the n-doped layer not covered by the patterned first dielectric layer to form an etched region of the n-doped layer surrounding a mesa structure. The mesa structure includes the mesa region of the n-doped layer capped by the patterned first dielectric layer. The method further includes roughening the etched region of the n-doped layer to form a scattering minor. The method further includes removing the patterned first dielectric layer to expose the mesa region of the n-doped layer of the mesa structure. The method further includes forming a patterned second dielectric layer on the scattering mirror. The method further includes growing an active layer on top of the mesa region of the n-doped layer of the mesa structure. The method further includes growing a p-doped layer of the semiconductor material to cover the top surface and the upper portion of sidewalls of the active layer. The method further includes removing the patterned second dielectric layer to expose the scattering minor. The method further includes forming electrodes over the p-doped layer and the n-doped layer.

The present disclosure also provides a LED device. In accordance with one or more embodiments of the present disclosure, the LED device includes a substrate. The LED device also includes an n-doped layer on the substrate having a mesa region adjacent to a roughened region. The top surface of the mesa region is higher than the top surface of the roughened region. The LED device also includes an active layer formed on top of the mesa region of the n-doped layer. The LED device further includes a p-doped layer formed on the active layer to cap the top surface and portions of sidewalls of the active layer. The LED device further includes electrodes disposed on the p-doped layer and the roughened region of the n-doped layer. The roughened region of the n-doped layer scatters light emitted from the active layer.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

What is claimed is:

1. A method of fabricating a light emitting diode (LED) comprising:
   providing a growth substrate;
   growing first epitaxial layers on the growth substrate, wherein the first epitaxial layers include an un-doped layer above the growth substrate and an n-doped layer above the un-doped layer;
   patterning the n-doped layer to form a first region of the n-doped layer and a mesa region of the n-doped layer adjacent to the first region;
   etching the first region of the n-doped layer to create a roughened surface of the first region of the n-doped layer:,
   growing additional epitaxial layers on the mesa region of the n-doped layer wherein the additional epitaxial layers include an active layer above the mesa region of the n-doped layer and a p-doped layer above the active layer; and
   forming metal contacts on the p-doped layer and on the roughened surface of the n-doped layer in the first region;
   wherein said growing additional epitaxial layers comprises growing the p-doped layer to cap the active layer on both a top surface and an upper portion of lateral sides of the active layer.

2. The method of claim 1, wherein said patterning the n-doped layer comprises forming a patterned first dielectric layer on the mesa region of the n-doped layer.

3. The method of claim 2, wherein said growing additional epitaxial layers comprises:
   removing the patterned first dielectric layer to expose the mesa region of the n-doped layer;
   forming a patterned second dielectric layer on the first region of the n-doped layer;
   growing the additional epitaxial layers on the exposed mesa region of the n-doped layer; and
   removing the patterned second dielectric layer.

4. The method of claim 2, wherein said etching the first region of the n-doped layer to create a roughened surface comprises etching the first region by using the patterned first dielectric layer as a mask.

5. The method of claim 3, wherein said growing the additional epitaxial layers comprises growing the active layer to have a top surface that is higher than a top surface of the patterned second dielectric layer on the first region.

6. The method of claim 5, wherein said growing the additional epitaxial layers further comprises growing the p-doped layer to cap the top surface and sidewalls of the active layer that protrude above the top surface of the patterned second dielectric layer.

7. The method of claim 1, wherein said forming metal contacts comprises: forming a patterned current spreading layer on the p-doped layer; forming a p-electrode on the patterned current spreading layer; and forming an n-electrode on the roughened surface of the n-doped layer of the first region.

8. A method of forming a light emitting diode (LED) comprising:
providing a growth substrate;
growing an n-doped layer of a semiconductor material on the growth substrate;
forming a patterned first dielectric layer to cover a mesa region of the n-doped layer;
etching the n-doped layer not covered by the patterned first dielectric layer to form an etched region of the n-doped layer surrounding a mesa structure, wherein the mesa structure includes the mesa region of the n-doped layer capped by the patterned first dielectric layer;
roughening the etched region of the n-doped layer to form a scattering mirror;
removing the patterned first dielectric layer to expose the mesa region of the n-doped layer of the mesa structure;
forming a patterned second dielectric layer on the scattering mirror;
growing an active layer on top of the mesa region of the n-doped layer of the mesa structure;
growing a p-doped layer of the semiconductor material to cover a top surface and an upper portion of sidewalls of the active layer of the mesa structure;
removing the patterned second dielectric layer to expose the scattering mirror; and
forming electrodes over the p-doped layer and the n-doped layer.

9. The method of claim 8, wherein said etching the n-doped layer comprises:
etching a top portion of the n-doped layer not covered by the patterned first dielectric layer to define the mesa structure, wherein the mesa structure is thicker than the etched region of the n-doped layer.

10. The method of claim 8, wherein said etching the n-doped layer comprises a buffered oxide etching process.

11. The method of claim 8, wherein said etching the n-doped layer comprises a reactive ion etching process.

12. The method of claim 8, wherein said roughening the etched region comprises:
roughening the etched region of the n-doped layer by using the patterned first dielectric layer as a mask to protect the mesa region of the n-coped layer of the mesa structure.

13. The method of claim 8, wherein said roughening the etched region of the n-doped layer comprises a photo-electrochemical etching process.

14. The method of claim 8, wherein said forming a patterned second dielectric layer comprises exposing a top surface of the mesa region of the n-doped layer of the mesa structure, wherein the top surface of the mesa region of the n-doped layer is recessed from a top surface of the patterned second dielectric layer surrounding the mesa structure.

15. The method of claim 8, wherein said growing an active layer comprises growing the active layer on top of the mesa region of the n-doped layer of the mesa structure to a sufficient thickness so a top surface of the active layer and portions of sidewalls of the active layer are higher than a top surface of the patterned second dielectric layer.

16. The method of claim 15, wherein said growing a p-doped layer comprises:
growing the p-doped layer so the p-doped layer covers the sidewalls of the active layer that are higher than the top surface of the patterned second dielectric layer.

17. The method of claim 8, wherein said forming electrodes comprises:
depositing a current spreading layer on the p-doped layer;
depositing a p-electrode on the current spreading layer; and
depositing an n-electrode on the scattering minor.

18. A light emitting diode(LED) comprising:
a substrate;
an n-doped layer on the substrate, wherein the n-doped layer has a mesa region adjacent to a roughened region, wherein a top surface of the mesa region is higher than a top surface of the roughened region;
an active layer disposed on top of the mesa region of the n-doped layer;
a p-doped layer disposed on the active layer, wherein the p-doped layer caps a top surface and portions of side walls of the active layer; and
electrodes disposed on the p-doped layer and the roughened region of the n-doped layer, wherein the roughened region of the n-doped layer scatters light emitted from the active layer.

19. The LED of claim 18, wherein the roughened region of the n-doped layer is formed without the presence of the active layer.

* * * * *